United States Patent
Seshadri et al.

(10) Patent No.: US 6,980,459 B2
(45) Date of Patent: Dec. 27, 2005

(54) NON-VOLATILE SRAM

(75) Inventors: Anand Seshadri, Plano, TX (US); Terence G. Blake, Dallas, TX (US); Jarrod R. Eliason, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 18 days.

(21) Appl. No.: 10/279,371

(22) Filed: Oct. 24, 2002

(65) Prior Publication Data

US 2004/0080972 A1   Apr. 29, 2004

(51) Int. Cl.[7] ........................ G11C 11/22; G11C 14/00
(52) U.S. Cl. ................. 365/145; 365/149; 365/185.08
(58) Field of Search .............................. 365/145, 104, 365/121, 149, 102, 185.08

(56) References Cited

U.S. PATENT DOCUMENTS

| | | | |
|---|---|---|---|
| 3,155,833 A | | 11/1964 | De Fries |
| 4,809,225 A | * | 2/1989 | Dimmler et al. ............. 365/149 |
| 5,424,975 A | * | 6/1995 | Lowrey et al. ............. 365/145 |
| 6,069,816 A | * | 5/2000 | Nishimura ................... 365/145 |
| 6,272,039 B1 | * | 8/2001 | Clemens et al. ............ 365/154 |
| 6,285,575 B1 | | 9/2001 | Miwa |
| 6,496,407 B2 | * | 12/2002 | Ashikaga .................... 365/145 |
| 6,552,923 B2 | * | 4/2003 | Houston ...................... 365/154 |
| 2002/0126522 A1 | * | 9/2002 | Miwa et al. ................ 365/154 |
| 2002/0159287 A1 | * | 10/2002 | Miwa et al. ................ 365/145 |
| 2004/0042247 A1 | * | 3/2004 | Takahashi et al. .......... 365/145 |

FOREIGN PATENT DOCUMENTS

| EP | 0 551 756 A1 | 7/1993 |
|---|---|---|
| EP | 1 239 492 A2 | 9/2002 |

OTHER PUBLICATIONS

Tohru Miwa, et al., "NV-SRAM: A Nonvolatile SRAM with Backup Ferroelectric Capacitors" IEEE Journal of Solid-State Circuits, vol. 36, No. 3, pp. 522-527, Mar. 2001.
Tohru Miwa, et al., "A Nonvolatile SRAM with Back-up Ferroelectric Capacitors" IEEE Custom Integrated Circuits Conference, pp. 65-68, 2000.

* cited by examiner

*Primary Examiner*—Anh Phung
*Assistant Examiner*—Toan Le
(74) *Attorney, Agent, or Firm*—Rose Alyssa Keagy; W. James Brady, III; Frederick J. Telecky, Jr.

(57) ABSTRACT

A SRAM cell wherein the pull up load of the cell is inherent ferroelectric leakage. The power down writeback may include boosting the word line. The power down writeback may also include discharging the plate from $V_{DD}$ to ground. Furthermore, the plate is held high during read and write operations.

10 Claims, 1 Drawing Sheet

NON-VOLATILE SRAM

BACKGROUND OF THE INVENTION

This invention relates to the use of at least one ferroelectric capacitor in a four transistor SRAM.

DETAILED DESCRIPTION OF THE INVENTION

Volatile memories lose their contents when power is removed, nonvolatile memories do not. Historically, an SRAM was considered a volatile memory. However, the use of at least one ferroelectric ("Fe") capacitor in a four transistor ("4T") SRAM configuration creates a non-volatile memory whose pull-up load is the inherent ferroelectric leakage. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

When an electric field is applied to a ferroelectric crystal, there is a charge displacement characterized by polarization, inherent to the crystal structure that does not disappear with the removal of the electric field. Applying an appropriate electric field to the crystal can reverse the direction of this polarization. Therefore, the direction of this polarization can be used to store the desired ones and zeros in a memory device. As a result, using a ferroelectric crystal will make the memory non-volatile.

Figure 1:
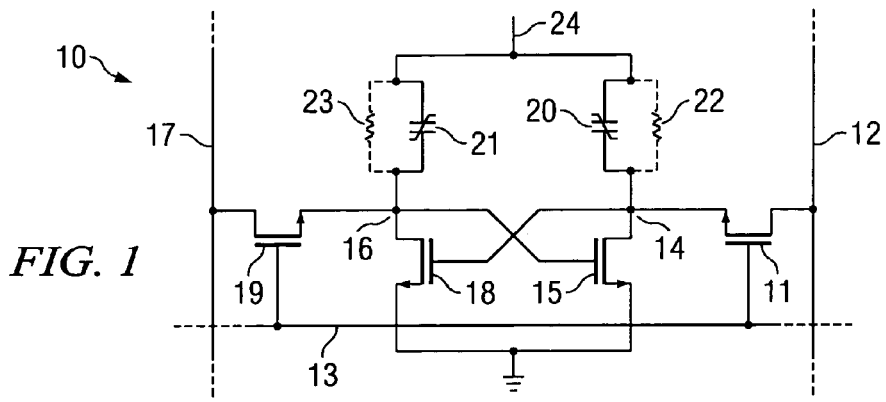
FIG. 1 is a circuit diagram of the 4T-2C NV SRAM.

Referring to the drawings, FIG. 1 shows the schematic of a nonvolatile SRAM having four transistors and two Fe capacitors (called "4T-2C NV SRAM"). The 4T-2C NV SRAM memory cell 10 includes a NMOS pass transistor 11 coupled to a bit line 12 and a word line 13. Pass transistor 11 is also coupled to storage node 14. A driver transistor 15 is coupled between the storage node 14 and ground. The gate of the driver transistor 15 is coupled to the inverse storage node 16. Another driver transistor 18 is coupled between inverse storage node 16 and ground. The gate of driver transistor 18 is coupled to storage node 14. Another NMOS pass transistor 19 is coupled between the inverse bit line 17 and the inverse storage node 16. The gate of inverse pass transistor 19 is also coupled to word line 13.

Two ferroelectric capacitors, 20 and 21, replace the load resistors present in the standard four-transistor, two-resistor SRAM cell (or alternatively, they replace the PMOS transistors of the six-transistor SRAM cell). Ferroelectric capacitor 20 is coupled between the storage node 14 and the plate 24. Similarly, ferroelectric capacitor 21 is coupled between the inverse storage node 16 and the same plate 24. These two capacitors 20, 21 make the memory cell 10 non-volatile. Furthermore, the inherent leakage of the ferroelectric capacitors 20,21 acts as load resistors, 22 and 23 respectively, for the memory cell 10.

The load resistor effect 22, 23 caused by the inherent ferroelectric capacitor leakage allows either of the storage nodes 14,16 to hold their "1" data, thereby making the memory cell 10 operate as a SRAM. In order to keep the load resistance 22,23 from failing (thereby causing a storage node voltage to dissipate to zero) the memory cell 10 must be designed to accommodate the following equation:

$$I_{leak}C > I_{off}D + I_{gate}DB$$

where $I_{leak}C$ is the leakage current of the capacitor 20 (i.e. the current through load resistor 22), $I_{off}D$ is the sub threshold leakage current of driver transistor 15 (i.e. the current flowing from node 14 to ground), and $I_{gate}DB$ is the gate leakage current of the inverse driver transistor 18 (the current flowing from node 14 into the gate of transistor 18).

The quiescent leakage current for memory cell 10 is defined by the following equation when storage node 14 and plate 24 are at $V_{DD}$, inverse storage node 16 is at ground, and both the bit line 12 and inverse bit line 17 are precharged to $V_{DD}$:

$$I_{leak} = I_{leak}CB + I_{off}D + I_{gate}DB$$

where $I_{leak}CB$ is the leakage current of the capacitor 21 (i.e. the current through load resistor 23), $I_{off}D$ is the sub threshold leakage current of driver transistor 15 (i.e. the current flowing from node 14 to ground), and $I_{gate}DB$ is the gate leakage current of the inverse driver transistor 18 (the current flowing from node 14 into the gate of transistor 18).

By definition, a logic "1" in the ferroelectric capacitor is achieved by applying $V_{DD}$ at the storage node and applying ground at the plate. Conversely, a logic "0" in the ferroelectric capacitor is achieved by applying $V_{DD}$ at the plate and ground at the storage node.

Figure 2:
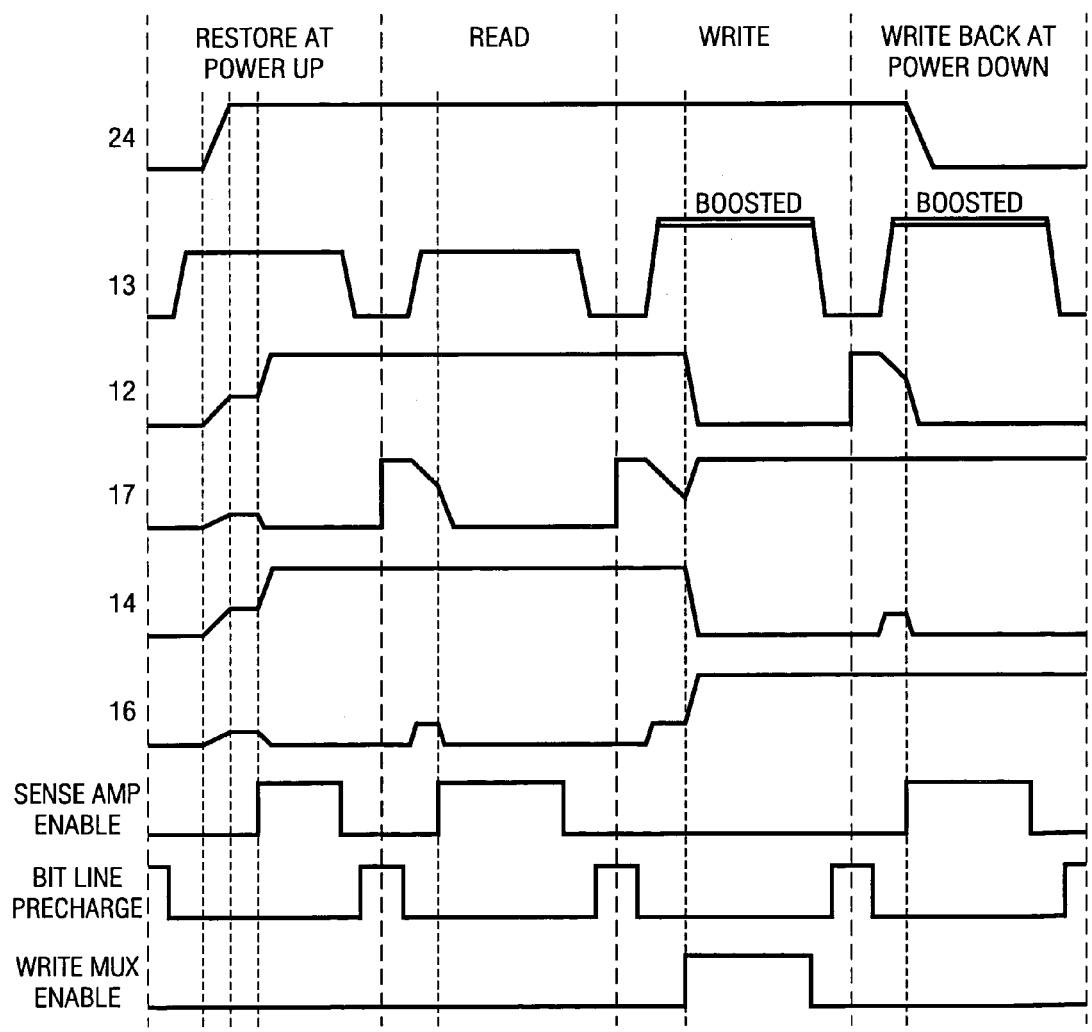
FIG. 2 is a timing diagram for the 4T-2C NV SRAM.

Referring to the drawings, FIG. 2 shows a timing diagram, which further explains the operation of the 4T-2C NV SRAM memory cell 10. Upon power-up, the SRAM is interrogated one word line at a time using the bit line capacitance as a load. Using an example situation where ferroelectric capacitor 20 is polarized at level "1" and inverse ferroelectric capacitor 21 is polarized at level "0"; the power up operation starts by setting the bit line 12 and inverse bit line 17 to ground by applying, and then removing, a bit line precharge. Note that at this point the storage node 14 and the inverse storage node 16 have been brought to "0" by the precharge operation of the bit line 12 and inverse bit line 17. Next, the word line 13 is turned on (brought to a level "1").

The plate 24 is now charged from ground to $V_{DD}$. As the plate 24 charges, the ferroelectric capacitor 20 and ferroelectric capacitor 21 cause the storage node 14 and inverse storage node 16 to charge up from ground level. This condition is similar to writing a logic "0" into both ferroelectric capacitors. Since ferroelectric capacitor 20 contains a switching charge from having entered power up mode with a logic "1" level, it now dumps this additional charge on storage node 14, whereas ferroelectric capacitor 21 that entered power up mode with a logic "0" level does not provide a switching charge to inverse storage node 16. Bit line 12 is charged through pass transistor 11 in response to the charging of the storage node 14. Similarly, the inverse bit line 17 is charged through inverse pass transistor 19 in response to the charging of the inverse storage node 16. The bit line provides the load capacitance necessary for reliable interrogation of the ferroelectric capacitor.

When the plate has completed charging to $V_{DD}$ the charge levels on bit line 12, inverse bit line 17, storage node 14 and inverse storage node 16 will hold relatively constant. However, since the storage node 14 and bit line 12 received additional switching charge, they are at a voltage level that is higher than the voltage level of the inverse storage node 16 and the inverse bit line 17. For example, in the best mode application, the storage node 14 and bit line 12 are 0.4V, while the inverse storage node 16 and the inverse bit line 17 are 0.2V. Therefore, the difference in voltage levels between the storage node 14 and the inverse storage node 16 is 200 mV. The difference in voltage levels between the bit line 12 and the inverse bit line 17 is also 200 mV.

As shown in FIG. 2, the voltage levels of bit line 12, inverse bit line 17, storage node 14, and inverse storage node 16 hold relatively constant until the timed sense amplifiers (connected to the bit lines and inverse bit lines, not shown) fire. When the sense amps fire they sense that the voltage level on bit line 12 is higher than the voltage level on inverse bit line 17. As a result, the sense amp side of bit line 12 now raises the bit line 12, and through it the storage node 14, to $V_{DD}$. At the same time the inverse bit line 17, and through it the inverse storage node 16, are brought to ground by the sense amp side connected to the inverse bit line 17.

The power up restore operation is now complete for the memory cells 10 on word line 13 and the next word line in the SRAM can begin its power up restore operation. Therefore the word line 13 is now returned to ground. In the best mode application, the word line 13 remains turned off until the interrogation process is complete for all desired word lines sharing the bit line 12 and inverse bit line 17.

Referring again to the drawings, FIG. 2 shows a timing diagram that further explains the read operation of the 4T-2C NV SRAM memory cell 10. The read operation starts by precharging the bit line 12 and inverse bit line 17 to $V_{DD}$. Once the precharge is complete the $V_{DD}$ precharging transistor is shut off and then the word line 13 is turned on. When the word line 13 turns on then the charge on the inverse bit line 17 is drained to ground through inverse pass transistor 19 and inverse driver transistor 18. Because of the current flowing through the inverse storage node 16 there is a temporary voltage level maintained on the inverse storage node 16 (the voltage level is determined by the β ratio of driver transistor 18 to pass transistor 19).

The large transistors in the timed sense amplifiers (connected to bit line 12 and inverse bit line 17) determine that inverse bit line 17 voltage is lower than the bit line 12 voltage. As a result the inverse bit line 17, and through it the inverse storage node 16, are brought to zero quickly through the sense amp transistors. The read operation is now complete for the memory cells 10 on word line 13 and therefore the word line 13 is now returned to ground.

The read operation is being described herein using an example situation where the storage node 14 is a "1" and the inverse storage node 16 is a "0". Because the bit line 12 and inverse bit line 17 are precharged to $V_{DD}$, the bit line 12 of cell 10 is undisturbed but the inverse bit line 17 is discharged. Note that this read operation is nondestructive for the 4T-2C NV SRAM cell 10. Even though the ferroelectric capacitor 20 was destructively read, its logic value was stored in the SRAM.

Referring again to the drawings, FIG. 2 shows a timing diagram that further explains the write operation of the 4T-2C NV SRAM memory cell 10. In this example, the goal is to change the state of the storage node 14 in the memory cell 10 from a "1" to a "0". The write operation starts by precharging bit line 12 and inverse bit line 17 to $V_{DD}$. Once the precharge is complete the $V_{DD}$ precharge transistor is shut off and then the word line 13 is turned on. When the word line 13 turns on then the voltage of the word line 13 is boosted, in the best mode application, to compensate for the NMOS transistor voltage drop across pass transistor 11 and inverse pass transistor 19. Therefore the boosted voltage on the word line 13 is $V_{DD}+V_{tpass}$.

If the word line voltage is not boosted, then the voltage on the inverse storage node 16, during a write, would initially be $V_{DD}-V_t$ and thereafter slowly rise (over several μs) to the desired value of $V_{DD}$ (because of the relatively large resistive value of the ferroelectric capacitor 23). If this situation occurred then there would be a risk that a write operation followed quickly by a read operation on the same cell 10 could flip (i.e. change) the state of the cell 10 because $V_{DD}-V_{tpass}$ on the gate of driver transistor 15 could be insufficient to keep storage node 14 close to ground while bit line 12 discharges from $V_{DD}$ to ground.

Initially, as the boosted word line 13 turns on the inverse bit line 17 will discharge because there is a "0" value stored in the inverse storage node 16. Again, the current flow across the inverse storage node 16 due to the inverse bit line 17 discharging will cause a voltage to be temporarily present at the inverse storage node 16.

Now a write signal, which multiplexes the desired data from the Input/Output pads, is applied to the bit line 12 and inverse bit line 17. In this case, bit line 12 is driven to ground and bit line 17 is retained at $V_{DD}$ through the write multiplexer (located elsewhere on the SRAM and not shown in FIG. 1). When the bit line 12 goes to ground, the inverse driver transistor 18 is turned off; writing a "0" into storage node 14 (and therefore also writing a "1" into inverse storage node 16). A "0" is now written into storage node 14, a "1" is written into inverse storage node 16, and the write operation is complete. Therefore, word line 13 is now turned off.

It should be noted that in the 4T-2C NV SRAM the state of the memory cell at power down is stored in the Ferroelectric capacitors 20 and 21. This is different than DRAM memory operation where the logic level is stored in the storage node's capacitor.

Referring again to the drawings, FIG. 2 shows a timing diagram that further explains the write back at power down operation of the 4T-2C NV SRAM memory cell 10. The interrogation procedure of the restore at power up operation (previously described) caused both ferroelectric capacitors 20,21 to become "0". Once all read/write operations are complete then the ferroelectric capacitors are re-polarized so that the SRAM can be completely powered down. The re-polarized capacitors 20,21 will hold the correct values, eliminating the need for depending on the storage nodes 14,16 to properly hold the correct values after power down.

Summarizing the events up to this point: the power-up restore operation started with a "1" in ferroelectric capacitor 20 and a "0" in ferroelectric capacitor 21. Then a ferroelectric interrogation operation was performed and both ferroelectric capacitors were written a "0" but the storage nodes 14,16 acquired the respective states of the ferroelectric capacitors during the interrogation process. Then a read operation was performed and both ferroelectric capacitors retained a "0" and the storage nodes 14,16 retained their respective states from the prior (interrogation) operation. Then a write operation was performed and a "1" was written to the inverse storage node 16 while a "0" was written to the storage node 14; but the ferroelectric capacitors were still at a "0" level. The write back at power down operation restores the final values of the storage nodes 14,16 to their respective ferroelectric capacitors 20,21.

The write back at power down operation starts by precharging the bit line 12 and inverse bit line 17 to $V_{DD}$. Once the precharge is complete the precharge transistor is shut off and then the word line 13 is turned on. When the word line 13 turns on the voltage of the word line 13 is again boosted. Since the storage node 14 began this operation at a "0" level (the previous write operation put storage node 14 at a "0" state), the bit line 12 will start discharging back to "0". Because current flows across storage node 14 as the bit line 12 discharges, a voltage level will be present temporarily at the storage node 14 during the discharge process.

The timed sense amplifiers now determine that the bit line 12 voltage is lower than the inverse bit line 17 voltage. As a result the bit line 12, and through it the storage node 14, are brought to zero through the sense amp transistors. Inverse bit line 17 and inverse storage node 16 remain at $V_{DD}$. Next, control circuitry (not shown) brings the plate 24 to ground, thereby writing a "1" into ferroelectric capacitor 21. The write back at power down operation is now complete and the word line 13 returns to zero.

The write back at power down operation continues (one word line per cycle for word lines sharing a common bit line pair) until all the desired data has been stored into the ferroelectric capacitors of each desired memory cell 10. Once the write back at power down operations are complete, the power to the SRAM can be removed. The data is maintained by the polarization of the ferroelectric capacitors and therefore the 4T-2C NV SRAM memory is non-volatile.

Various modifications to the invention as described above are within the scope of the claimed invention. As an example, PMOS transistors could be used instead of NMOS transistors. In addition, the functions comprehended by the invention could be accomplished in various process technologies such as bipolar technology. Moreover, it is within the scope of this invention to have a multi-port structure instead of a single port structure.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for performing a memory power down writeback comprising:
    boosting one word line per cycle and polarizing the ferroelectric capacitors of selected cells of said memory.

2. The method of claim 1 wherein said memory is a four transistor Static Random-Access Memory.

3. A method for performing a memory power down writeback comprising:
    boosting one word line per cycle and polarizing the ferroelectric capacitors of all cells of said memory.

4. The method of claim 3 wherein said memory is a four transistor Static Random-Access Memory.

5. A method of performing a read operation on a memory cell containing at least two ferroelectric capacitors comprising:
    precharging said memory cell's bit line and inverse bit line;
    turning on said memory cell's word line;
    sensing the contents of said memory cell; and
    holding high the plate of said at least two ferroelectric capacitors throughout said read operation.

6. The method of claim 5 wherein said memory cell is a four transistor Static Random-Access Memory cell.

7. A method for performing a memory power down writeback on a four NMOS transistor Static Random-Access Memory comprising:
    polarizing on one word line per cycle the ferroelectric capacitors of selected cells of said memory; and
    discharging the plate of said ferroelectric capacitors from $V_{DD}$ to ground.

8. A method for performing a memory power down writeback on a four NMOS transistor Static Random-Access Memory comprising:
    polarizing on one word line per cycle the ferroelectric capacitors of all cells of said memory; and
    discharging the plate of said ferroelectric capacitors from $V_{DD}$ to ground.

9. A method of performing a write operation on a memory cell containing at least two ferroelectric capacitors comprising:
    precharging said memory cell's bit line and inverse bit line;
    turning on said memory cell's word line, the voltage of said word line being boosted;
    applying a write signal that multiplexes desired data to said bit line and said inverse bit line; and
    holding high the plate of said at least two ferroelectric capacitors throughout said write operation.

10. The method of claim 9 wherein said memory cell is a four transistor Static Random-Access Memory cell.

* * * * *